United States Patent
Haba et al.

(10) Patent No.: US 7,554,206 B2
(45) Date of Patent: Jun. 30, 2009

(54) MICROELECTRONIC PACKAGES AND METHODS THEREFOR

(75) Inventors: Belgacem Haba, Saratoga, CA (US); Masud Beroz, Cary, NC (US); Ronald Green, San Jose, CA (US); Ilyas Mohammed, Santa Clara, CA (US); Stuart E. Wilson, Menlo Park, CA (US); Wael Zohni, San Jose, CA (US); Yoichi Kubota, Pleasanton, CA (US); Jesse Burl Thompson, Brentwood, CA (US)

(73) Assignee: Tessera, Inc., San Jose, CA (US)

( * ) Notice: Subject to any disclaimer, the term of this patent is extended or adjusted under 35 U.S.C. 154(b) by 211 days.

(21) Appl. No.: 11/607,372

(22) Filed: Dec. 1, 2006

(65) Prior Publication Data

US 2007/0077677 A1    Apr. 5, 2007

Related U.S. Application Data

(63) Continuation of application No. 11/014,439, filed on Dec. 16, 2004, now Pat. No. 7,176,043.

(60) Provisional application No. 60/533,210, filed on Dec. 30, 2003.

(51) Int. Cl.
*H01L 23/52* (2006.01)
*H01L 23/48* (2006.01)
*H01L 23/40* (2006.01)
*H01L 23/485* (2006.01)
*H01L 23/498* (2006.01)

(52) U.S. Cl. .................. 257/780; 257/737; 257/738; 257/779; 257/E23.021; 257/E23.069; 438/612; 438/613

(58) Field of Classification Search ............... 257/737, 257/738, 779, 780, E23.021, E23.069; 438/612, 438/613
See application file for complete search history.

(56) References Cited

U.S. PATENT DOCUMENTS

| 4,695,870 | A | 9/1987 | Patraw |
|---|---|---|---|
| 4,716,049 | A | 12/1987 | Patraw |

(Continued)

FOREIGN PATENT DOCUMENTS

JP    62-68015 A    9/1994

OTHER PUBLICATIONS

North Corporation, "Processed Intra-layer Interconnection Material for PWBs [Etched Copper Bump with Copper Foil]," NMBI™, Version 2001.6.

(Continued)

*Primary Examiner*—Luan C Thai
(74) *Attorney, Agent, or Firm*—Lerner, David, Littenberg, Krumholz & Mentlik, LLP

(57) ABSTRACT

A microelectronic assembly includes a microelectronic package having a microelectronic element with faces and contacts, a flexible substrate spaced from and overlying a first face of the microelectronic element, and a plurality of conductive posts extending from the flexible substrate and projecting away from the first face of the microelectronic element, at least some of the conductive posts being electrically interconnected with the microelectronic element. The package includes a plurality of support elements disposed between the microelectronic element and the substrate and supporting the flexible substrate over the microelectronic element. At least some of the conductive posts are offset from the support elements. The assembly includes a circuitized substrate having conductive pads confronting the conductive posts of the microelectronic package, whereby the conductive posts are electrically interconnected with the conductive pads.

13 Claims, 14 Drawing Sheets

U.S. PATENT DOCUMENTS

| | | |
|---|---|---|
| 4,804,132 A | 2/1989 | Difrancesco |
| 4,902,600 A | 2/1990 | Tamagawa et al. |
| 4,924,353 A | 5/1990 | Patraw |
| 4,975,079 A | 12/1990 | Beaman et al. |
| 4,982,265 A | 1/1991 | Watanabe et al. |
| 5,083,697 A | 1/1992 | Difrancesco |
| 5,138,438 A | 8/1992 | Masayuki et al. |
| 5,148,265 A | 9/1992 | Khandros et al. |
| 5,148,266 A | 9/1992 | Khandros et al. |
| 5,189,505 A | 2/1993 | Bartelink |
| 5,196,726 A | 3/1993 | Nishiguchi et al. |
| 5,214,308 A | 5/1993 | Nishiguchi et al. |
| 5,397,997 A | 3/1995 | Tuckerman et al. |
| 5,455,390 A | 10/1995 | DiStefano et al. |
| 5,518,964 A | 5/1996 | DiStefano et al. |
| 5,615,824 A | 4/1997 | Fjelstad et al. |
| 5,656,550 A | 8/1997 | Tsuji et al. |
| 5,659,952 A | 8/1997 | Kovac et al. |
| 5,679,977 A | 10/1997 | Khandros et al. |
| 5,731,709 A | 3/1998 | Pastore et al. |
| 5,802,699 A | 9/1998 | Fjelstad et al. |
| 5,811,982 A | 9/1998 | Beaman et al. |
| 5,854,507 A | 12/1998 | Miremadi et al. |
| 5,973,391 A | 10/1999 | Bischoff et al. |
| 5,980,270 A | 11/1999 | Fjelstad et al. |
| 6,032,359 A | 3/2000 | Carroll |
| 6,052,287 A | 4/2000 | Palmer et al. |
| 6,054,756 A | 4/2000 | DiStefano et al. |
| 6,177,636 B1 | 1/2001 | Fjelstad |
| 6,202,297 B1 | 3/2001 | Faraci et al. |
| 6,258,625 B1 | 7/2001 | Brofman et al. |
| 6,332,270 B2 | 12/2001 | Beaman et al. |
| 6,358,627 B2 | 3/2002 | Benenati et al. |
| 6,362,525 B1 | 3/2002 | Rahim |
| 6,458,411 B1 | 10/2002 | Goossen et al. |
| 6,495,914 B1 | 12/2002 | Sekine et al. |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,550,666 B2 | 4/2003 | Chew et al. |
| 6,555,918 B2 | 4/2003 | Masuda et al. |
| 6,560,117 B2 | 5/2003 | Moon |
| 6,578,754 B1 | 6/2003 | Tung |
| 6,624,653 B1 | 9/2003 | Cram |
| 6,647,310 B1 | 11/2003 | Yi et al. |
| 6,681,982 B2 | 1/2004 | Tung |
| 6,782,610 B1 | 8/2004 | Iijima et al. |
| 6,870,274 B2 | 3/2005 | Huang et al. |
| 6,902,869 B2 | 6/2005 | Appelt et al. |
| 2002/0125571 A1 | 9/2002 | Corisis et al. |
| 2002/0153602 A1 | 10/2002 | Tay et al. |
| 2003/0107118 A1 | 6/2003 | Pflughaupt et al. |
| 2003/0132518 A1 | 7/2003 | Castro |
| 2003/0164540 A1 | 9/2003 | Lee et al. |
| 2004/0031972 A1 | 2/2004 | Pflughaupt et al. |
| 2005/0116326 A1 | 6/2005 | Haba et al. |
| 2005/0285246 A1 | 12/2005 | Haba et al. |

OTHER PUBLICATIONS

Neo-Manhattan Technology, A Novel HDI Manufacturing Process, "High-Density Interconnects for Advanced Flex Substrates & 3-D Package Stacking,"IPC Flex & Chips Symposium, Tempe, AZ, Feb. 11-12, 2003.

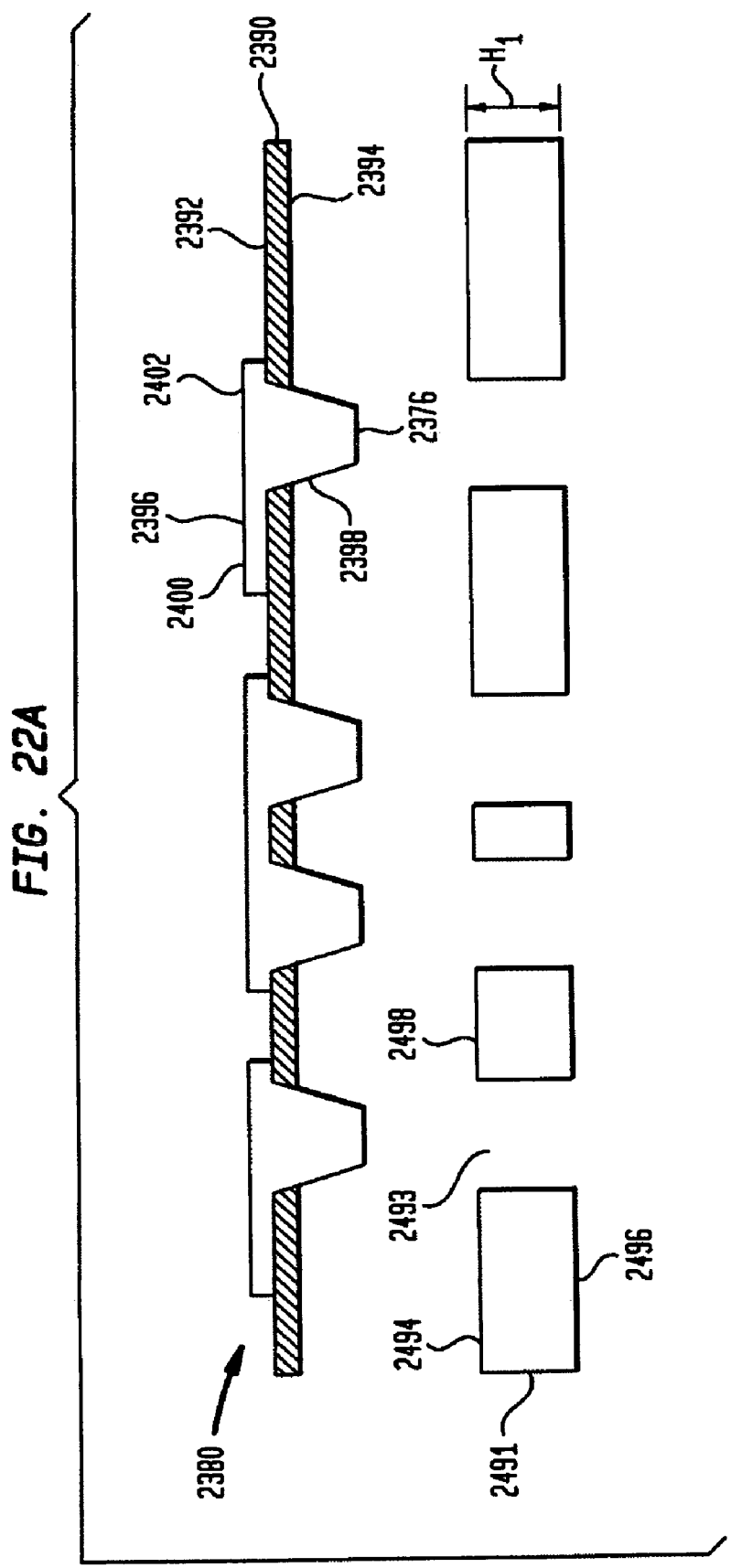

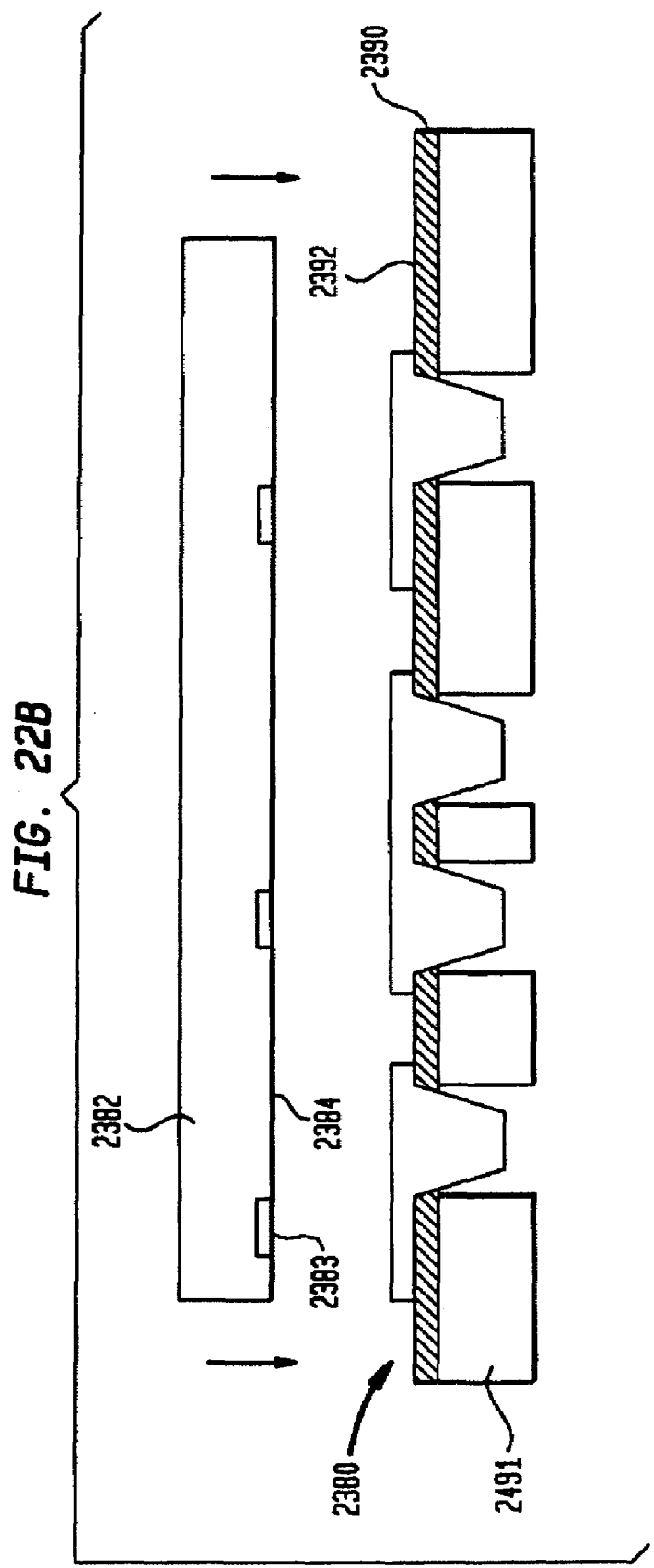

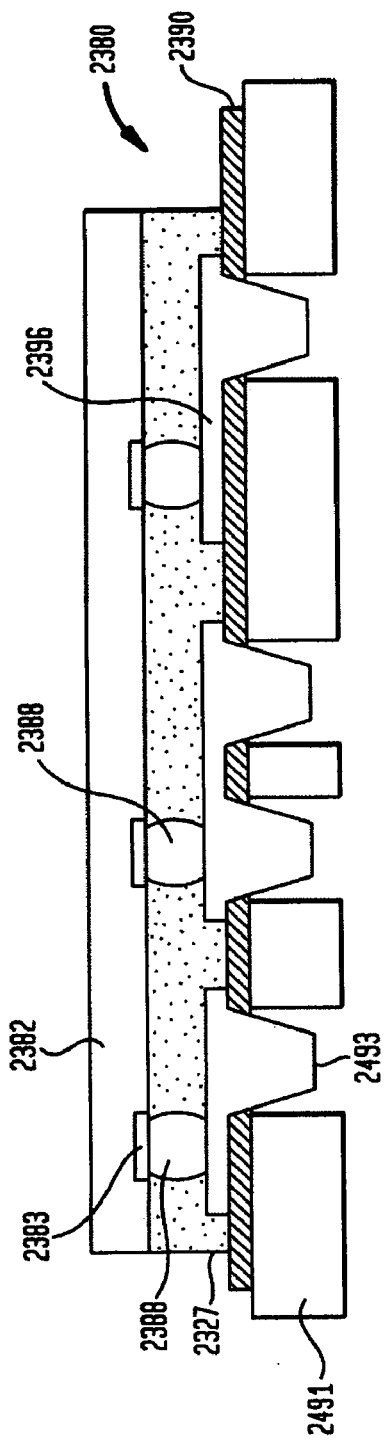
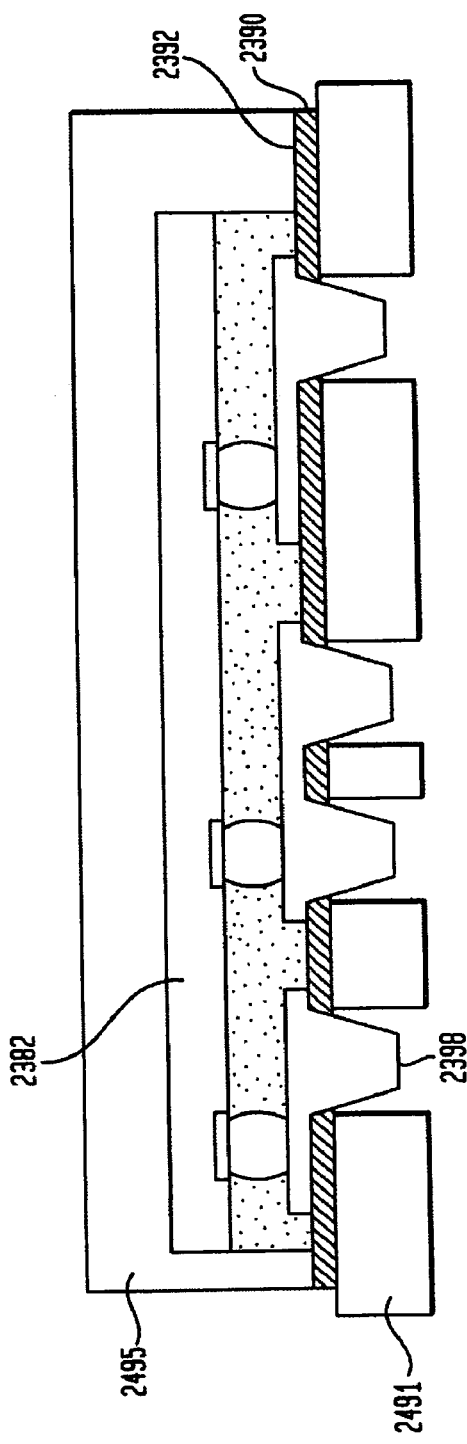

MICROELECTRONIC PACKAGES AND METHODS THEREFOR

CROSS REFERENCE TO RELATED APPLICATIONS

This application is a continuation of U.S. patent application Ser. No. 11/014,439, filed Dec. 16, 2004 now U.S. Pat. No. 7,176,043, now allowed, which claims the benefit of the filing date of U.S. Provisional Patent Application No. 60/533,210, filed Dec. 30, 2003, entitled "Microelectronic Packages and Methods Therefor," the disclosures of which are hereby incorporated by reference herein.

The present invention relates to microelectronic packages and to methods of making and testing microelectronic packages.

BACKGROUND OF THE INVENTION

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Assemblies including packages can suffer from stresses imposed by differential thermal expansion and contraction of the device and the substrate. During operation, as well as during manufacture, a semiconductor chip tends to expand and contract by an amount different from the amount of expansion and contraction of a circuit board. Where the terminals of the package are fixed relative to the chip or other device, such as by using solder, these effects tend to cause the terminals to move relative to the contact pads on the circuit board. This can impose stresses in the solder that connects the terminals to the contact pads on the circuit board. As disclosed in certain preferred embodiments of U.S. Pat. Nos. 5,679,977; 5,148,266; 5,148,265; 5,455,390; and 5,518,964, the disclosures of which are incorporated by reference herein, semiconductor chip packages can have terminals that are movable with respect to the chip or other device incorporated in the package. Such movement can compensate to an appreciable degree for differential expansion and contraction.

Testing of packaged devices poses another formidable problem. In some manufacturing processes, it is necessary to make temporary connections between the terminals of the packaged device and a test fixture, and operate the device through these connections to assure that the device is fully functional. Ordinarily, these temporary connections must be made without bonding the terminals of the package to the test fixture. It is important to assure that all of the terminals are reliably connected to the conductive elements of the test fixture. However, it is difficult to make connections by pressing the package against a simple test fixture such as an ordinary circuit board having planar contact pads. If the terminals of the package are not coplanar, or if the conductive elements of the test fixture are not coplanar, some of the terminals will not contact their respective contact pads on the test fixture. For example, in a BGA package, differences in the diameter of the solder balls attached to the terminals, and non-planarity of the chip carrier, may cause some of the solder balls to lie at different heights.

These problems can be alleviated through the use of specially constructed test fixtures having features arranged to compensate for non-planarity. However, such features add to the cost of the test fixture and, in some cases, introduce some unreliability into the test fixture itself. This is particularly undesirable because the test fixture, and the engagement of the device with the test fixture, should be more reliable than the packaged devices themselves in order to provide a meaningful test. Moreover, devices intended for high-frequency operation typically must be tested by applying high frequency signals. This requirement imposes constraints on the electrical characteristics of the signal paths in the test fixture, which further complicates construction of the test fixture.

Additionally, when testing packaged devices having solder balls connected with terminals, solder tends to accumulate on those parts of the test fixture that engage the solder balls. This accumulation of solder residue can shorten the life of the test fixture and impair its reliability.

A variety of solutions have been put forth to deal with the aforementioned problems. Certain packages disclosed in the aforementioned patents have terminals that can move with respect to the microelectronic device. Such movement can compensate to some degree for non-planarity of the terminals during testing.

U.S. Pat. Nos. 5,196,726 and 5,214,308, both issued to Nishiguchi et al., disclose a BGA-type approach in which bump leads on the face of the chip are received in cup-like sockets on the substrate and bonded therein by a low-melting point material. U.S. Pat. No. 4,975,079 issued to Beaman et al. discloses a test socket for chips in which dome-shaped contacts on the test substrate are disposed within conical guides. The chip is forced against the substrate so that the solder balls enter the conical guides and engage the dome-shaped pins on the substrate. Sufficient force is applied so that the dome-shaped pins actually deform the solder balls of the chip.

A further example of a BGA socket may be found in commonly assigned U.S. Pat. No. 5,802,699, issued Sep. 8, 1998, the disclosure of which is hereby incorporated by reference herein. The '699 patent discloses a sheet-like connector having a plurality of holes. Each hole is provided with at least one resilient laminar contact extending inwardly over a hole. The bump leads of a BGA device are advanced into the holes so that the bump leads are engaged with the contacts. The assembly can be tested, and if found acceptable, the bump leads can be permanently bonded to the contacts.

Commonly assigned U.S. Pat. No. 6,202,297, issued Mar. 20, 2001, the disclosure of which is hereby incorporated by reference herein, discloses a connector for microelectronic devices having bump leads and methods for fabricating and using the connector. In one embodiment of the '297 patent, a dielectric substrate has a plurality of posts extending upwardly from a front surface. The posts may be arranged in an array of post groups, with each post group defining a gap therebetween. A generally laminar contact extends from the top of each post. In order to test a device, the bump leads of the device are each inserted within a respective gap thereby engaging the contacts which wipe against the bump lead as it continues to be inserted. Typically, distal portions of the contacts deflect downwardly toward the substrate and outwardly away from the center of the gap as the bump lead is inserted into a gap.

Commonly assigned U.S. Pat. No. 6,177,636, the disclosure of which is hereby incorporated by reference herein, discloses a method and apparatus for providing interconnections between a microelectronic device and a supporting substrate. In one preferred embodiment of the '636 patent, a method of fabricating an interconnection component for a microelectronic device includes providing a flexible chip carrier having first and second surfaces and coupling a conductive sheet to the first surface of the chip carrier. The conductive sheet is then selectively etched to produce a plurality of substantially rigid posts. A compliant layer is provided on the second surface of the support structure and a microelectronic device such as a semiconductor chip is engaged with the compliant layer so that the compliant layer lies between the microelectronic device and the chip carrier, and leaving the posts projecting from the exposed surface of the chip carrier. The posts are electrically connected to the microelectronic device. The posts form projecting package terminals that can be engaged in a socket or solder-bonded to features of a substrate as, for example, a circuit panel. Because the posts are movable with respect to the microelectronic device, such a package substantially accommodates thermal coefficient of expansion mismatches between the device and a supporting substrate when the device is in use. Moreover, the tips of the posts can be coplanar or nearly coplanar.

Despite all of the above-described advances in the art, still further improvements in making and testing microelectronic packages would be desirable.

SUMMARY OF THE INVENTION

One aspect of the invention provides a microelectronic package comprising which includes a microelectronic element such as a semiconductor chip and a flexible substrate spaced from and overlying a first face of the microelectronic element. The package according to this aspect of the invention desirably includes a plurality of conductive posts extending from the flexible substrate and projecting away from the microelectronic element, at least some of the conductive posts being electrically interconnected with said microelectronic element. Most preferably, the package according to this aspect of the invention includes a plurality of support elements disposed between the microelectronic element and said substrate and supporting said flexible substrate over the microelectronic element. Desirably, at least some of the conductive posts are offset in horizontal directions parallel to the plane of the flexible substrate from the support elements. For example, the support elements may be disposed in an array with zones of the flexible substrate disposed between adjacent support elements, and the posts may be disposed near the centers of such zones.

The offset between the posts and the support elements allows the posts, and particularly the bases of the posts adjacent the substrate, to move relative to the microelectronic element. Most preferably, the arrangement allows each post to move independently of the other posts. The movement of the posts allows the tips of the plural posts to simultaneously engage contact pads on a circuit board despite irregularities in the circuit board or the package, such as warpage of the circuit board. This facilitates testing of the package using a simple test board which may have substantially planar contacts, and avoids the need for specialized, expensive test sockets.

Most preferably, the flexible substrate overlies the front or contact-bearing face of the microelectronic element. At least some of the support elements desirably are electrically conductive elements such as solder balls. The conductive support elements may electrically interconnect at least some of the contacts of the microelectronic element with at least some of the conductive posts. In preferred forms, this arrangement can prove low-impedance conductive paths between the posts and the microelectronic element, suitable for high-frequency signal transmission. Most desirably, at least some of the posts are connected to at least some of the contacts on the microelectronic element by conductive support elements immediately adjacent to those posts. Preferably, conductive traces provided on the flexible substrate electrically interconnect at least some of the conductive posts with at least some of the conductive support elements. These traces may be very short; the length of each trace desirably is equal to the offset distance between a single post and a single support element.

A further aspect of the present invention provides a microelectronic assembly which desirably includes a package as discussed above and a circuit panel having contact pads. Tips of the posts remote from the flexible substrate confront the contact pads and are electrically connected thereto, most preferably by electrically conductive bonding material such as solder. As further discussed below, the assembly can be compact and highly reliable.

A further aspect of the invention provides a microelectronic package which includes a microelectronic element and a flexible substrate spaced from and overlying said microelectronic element. The flexible substrate is supported above said front face of said microelectronic element so that said substrate is at least partially unconstrained in flexure. For example, the flexible substrate may be supported by support elements as described above, or by other means such as a continuous compliant layer. Here again, the package includes a plurality of conductive posts extending from the flexible substrate and projecting away from the microelectronic element, the conductive posts being electrically connected to the microelectronic element. The conductive posts have bases facing toward the flexible substrate. The package according to this embodiment of the invention desirably includes elements referred to herein as "focusing elements" disposed between the bases of at least some of the posts and the substrate and mechanically interconnecting the bases of the conductive posts with the substrate. The focusing elements desirably have smaller areas than the bases of the posts. As further discussed below, this arrangement facilitates flexing of the substrate and movement of the posts.

Yet another aspect of the invention provides methods of processing microelectronic packages. Method according to this aspect of the invention desirably include the step of advancing a microelectronic package having a flexible substrate supported over a surface of a microelectronic element and having electrically conductive posts projecting from said substrate until tips of said posts engage contact pads on a test circuit panel and the substrate flexes so that at least some base portions of said posts adjacent said flexible substrate move relative to the microelectronic element. In preferred methods according to this aspect of the present invention, movement of the bases of the posts contribute to movement of the tips, allowing the tips to engage contact pads even where the contact pads themselves are not coplanar with one another.

The method according to this aspect of the invention may include the further steps of maintaining the tips of the posts in contact with said contact pads and testing the package during the maintaining step, as by transmitting signals to and from the package through the engaged contact pads and posts. The method may be practiced using a simple circuit panel, with simple contact pads. The method may further include disengaging the tips from the contact pads after testing, and may also include bonding the tips of the posts to electrically conductive elements of a circuit panel after disengagement from the test circuit panel.

BRIEF DESCRIPTION OF THE DRAWINGS

FIGS. 7-10 are fragmentary sectional views depicting packages according to additional embodiments of the invention.

FIGS. 22A-22D show a method of making a microelectronic assembly, in accordance with certain preferred embodiments of the present invention.

DETAILED DESCRIPTION

Figure 1:
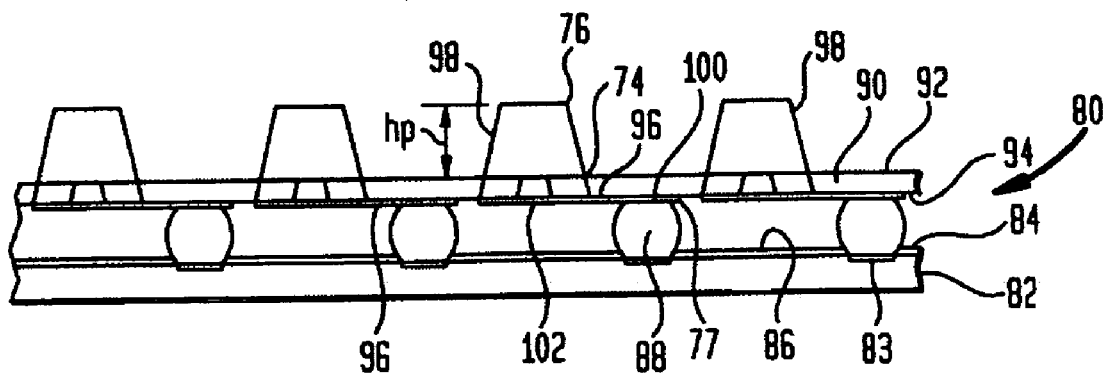
FIG. 1 is a diagrammatic sectional view of a package according to one embodiment of the invention.

A microelectronic package 80, in accordance with one embodiment of the present invention, includes a microelectronic element, such as a semiconductor chip 82, having a front or contact bearing face 84 and electrical contacts 83 exposed at face 84. A passivation layer 86 may be formed over the contact bearing face 84 with openings at contacts 83.

Figure 2:
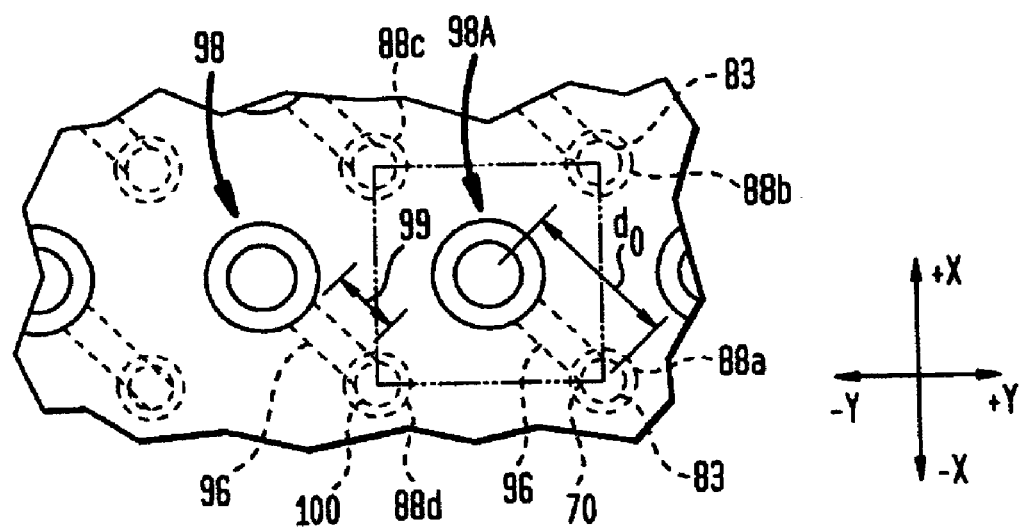
FIG. 2 is a fragmentary plan view of the package shown in FIG. 1.

The microelectronic package 80 also includes conductive support elements 88 such as solder balls in substantial alignment and electrically interconnected with contacts 83. As best seen in FIG. 2, contacts 83 and support elements 88 are disposed in an array which in this case is a rectilinear grid, having equally spaced columns extending in a first horizontal direction x and equally spaced rows extending in a second horizontal direction y orthogonal to the first horizontal direction. Each contact 83 and support element 88 is disposed at an intersection of a row and a column, so that each set of four support elements 88 at adjacent intersections, such as support elements 88a, 88b, 88c and 88d, defines a generally rectangular, and preferably square, zone 89. The directions referred to in this disclosure are directions in the frame of reference of the components themselves, rather than in the normal gravitational frame of reference. Horizontal directions are directions parallel to the plane of the front surface 84 of the chip, whereas vertical directions are perpendicular to that plane.

The package also includes a flexible dielectric substrate 90, such as a polyimide or other polymeric sheet, including a top surface 92 and a bottom surface 94 remote therefrom. Although the thickness of the dielectric substrate will vary with the application, the dielectric substrate most typically is about 10 μm-100 μm thick. The flexible sheet 90 has conductive traces 96 thereon. In the particular embodiment illustrated in FIG. 1, the conductive traces are disposed on the bottom surface 94 of the flexible sheet 90. However, in other embodiments, the conductive traces 96 may extend on the top surface 92 of the flexible sheet 90; on both the top and bottom faces or within the interior of flexible substrate 90. Thus, as used in this disclosure, a statement that a first feature is disposed "on" a second feature should not be understood as requiring that the first feature lie on a surface of the second feature. Conductive traces 96 may be formed from any electrically conductive material, but most typically are formed from copper, copper alloys, gold or combinations of these materials. The thickness of the traces will also vary with the application, but typically is about 5 µm-25 µm. Traces 96 are arranged so that each trace has a support end 100 and a post end 102 remote from the support end.

Electrically conductive posts or pillars 98 project from the top surface 92 of flexible substrate 90. Each post 98 is connected to the post end 102 of one of the traces 96. In the particular embodiment of FIGS. 1 and 2, the posts 98 extend upwardly through the dielectric sheet 92, from the post ends of the traces. The dimensions of the posts can vary over a significant range, but most typically the height $h_p$ of each post above the top surface 92 of the flexible sheet is about 50-300 µm. Each post has a base 74 adjacent the flexible sheet 90 and a tip 76 remote from the flexible sheet. In the particular embodiment illustrated, the posts are generally frustoconical, so that the base 74 and tip 76 of each post are substantially circular. The bases of the posts typically are about 100-600 µm in diameter, whereas the tips typically are about 40-200 µm in diameter. The posts may be formed from any electrically conductive material, but desirably are formed from metallic materials such as copper, copper alloys, gold and combinations thereof. For example, the posts may be formed principally from copper with a layer of gold at the surfaces of the posts.

The dielectric sheet 92, traces 96 and posts 98 can be fabricated by a process such as that disclosed in co-pending, commonly assigned U.S. Provisional Patent Application Ser. No. 60/508,970, the disclosure of which is incorporated by reference herein. As disclosed in greater detail in the '970 Application, a metallic plate is etched or otherwise treated to form numerous metallic posts projecting from the plate. A dielectric layer is applied to this plate so that the posts project through the dielectric layer. An inner or side of the dielectric layer faces toward the metallic plate, whereas the outer side of the dielectric layer faces towards the tips of the posts. The dielectric layer may be fabricated by coating a dielectric such as polyimide onto the plate around the posts or, more typically, by forcibly engaging the posts with the dielectric sheet so that the posts penetrate through the sheet. Once the sheet is in place, the metallic plate is etched to form individual traces on the inner side of the dielectric layer. Alternatively, conventional processes such as plating may form the traces or etching, whereas the posts may be formed using the methods disclosed in commonly assigned U.S. Pat. No. 6,177,636, the disclosure of which is hereby incorporated by reference herein. In yet another alternative, the posts may be fabricated as individual elements and assembled to the flexible sheet in any suitable manner, which connects the posts to the traces.

As best appreciated with reference to FIG. 2, the support ends 100 of the leads are disposed in a regular grid pattern corresponding to the grid pattern of the support elements, whereas the posts 98 are disposed in a similar grid pattern. However, the grid pattern of the posts is offset in the first and second horizontal directions x and y from the grid pattern of the support ends 100 and support elements 88, so that each post 98 is offset in the −y and +x directions from the support end 100 of the trace 96 connected to that post.

The support end 100 of each trace 96 overlies a support element 88 and is bonded to such support element, so that each post 98 is connected to one support element. In the embodiment illustrated, where the support elements are solder balls, the bonds can be made by providing the support elements on the contacts 83 of the chip and positioning the substrate or flexible sheet 90, with the posts and traces already formed thereon, over the support elements and reflowing the solder balls by heating the assembly. In a variant of this process, the solder balls can be provided on the support ends 100 of the traces. The process steps used to connect the support ends of the traces can be essentially the same used in flip-chip solder bonding of a chip to a circuit panel.

As mentioned above, the posts 98 are offset from the support elements 88 in the x and y horizontal directions. Unless otherwise specified herein, the offset distance do (FIG. 2) between a post and a support element can be taken as the distance between the center of area of the base 74 (FIG. 1) of the post and the center of area of the upper end 77 (FIG. 1) of the support element 88. In the embodiment shown, where both the base of the post and the upper end of the support element have circular cross-sections, the centers of area lie at the geometric centers of these elements. Most preferably, the offset distance $d_o$ is large enough that there is a gap 99 (FIG. 2) between adjacent edges of the base of the post and the top end of the support element. Stated another way, there is a portion of the dielectric sheet 90 in gap 99, which is not in contact with either the top end 77 of the support element or the base 74 of the post.

Each post lies near the center of one zone 89 defined by four adjacent support elements 88, so that these support elements are disposed around the post. For example, support elements 88a-88d are disposed around post 98a. Each post is electrically connected by a trace and by one of these adjacent support elements to the microelectronic device 82. The offset distances from a particular post to all of the support elements adjacent to that post may be equal or unequal to one another.

In the completed unit, the upper surface 92 of the substrate or flexible sheet 92 forms an exposed surface of the package, whereas posts 98 project from this exposed surface and provide terminals for connection to external elements.

The conductive support elements 88 create electrically conductive paths between the microelectronic element 82 and the flexible substrate 90 and traces 96. The conductive support elements space the flexible substrate 90 from the contact bearing face 84 of microelectronic element 82. As further discussed below, this arrangement facilitates movement of the posts 98.

Figure 3:
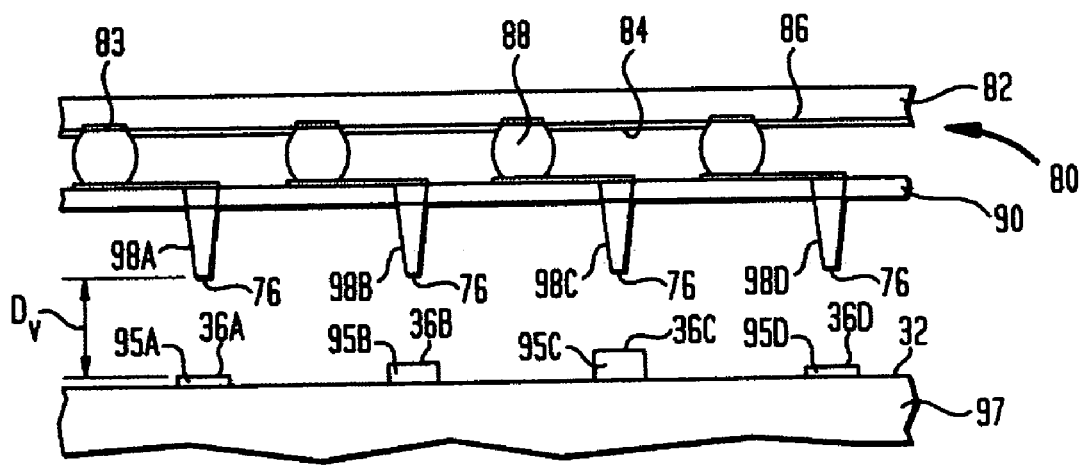
FIG. 3 is a diagrammatic elevational view depicting the package of FIGS. 1-2 in conjunction with a test circuit panel during one step of a method according to one embodiment of the invention.

In a method of operation according to a further embodiment of the invention, a microelectronic package 80 such as the package discussed above with reference to FIGS. 1 and 2 is tested by juxtaposing the conductive posts 98 with contact pads 95 on a second microelectronic element 97 such as a circuitized test board (FIG. 3). The conductive posts 98A-98D are placed in substantial alignment with top surfaces of the respective contact pads 95A-95D. As is evident in the drawing figure, the top surfaces 36A-36D of the respective contact pads 95A-95D are disposed at different heights and do not lie in the same plane. Such non-planarity can arise from causes such as warpage of the circuit board 97 itself and unequal thicknesses of contact pads 95. Also, although not shown in FIG. 3, the tips 76 of the posts may not be precisely coplanar with one another, due to factors such as unequal heights of support elements 88; non-planarity of the front surface 84 of the microelectronic device; warpage of the dielectric substrate 90; and unequal heights of the posts themselves. Also, the package 80 may be tilted slightly with respect to the circuit board. For these and other reasons, the vertical distances Dv between the tips of the posts and the contact pads may be unequal.

Figure 4:
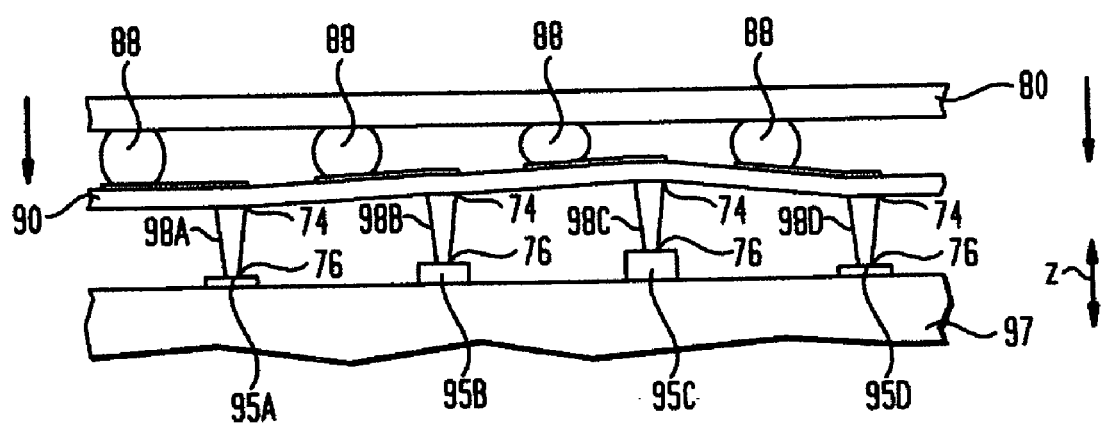
FIG. 4 is a view similar to FIG. 3 but depicting a later stage of the method.

Referring to FIG. 4, the microelectronic package 80 is moved toward the test board 97, by moving either the test board, the package or both. The tips 76 of the conductive posts 98A-98D engage the contact pads 95 and make electrical contact with the contact pads. The tips of the posts are able to move so as to compensate for the initial differences in vertical spacing Dv (FIG. 3), so that all of the tips can be brought into contact with all of the contact pads simultaneously using only a moderate vertical force applied to urge the package and test board 97 together. In this process, at least some of the post tips are displaced in the vertical or z direction relative to other post tips.

Figure 5:
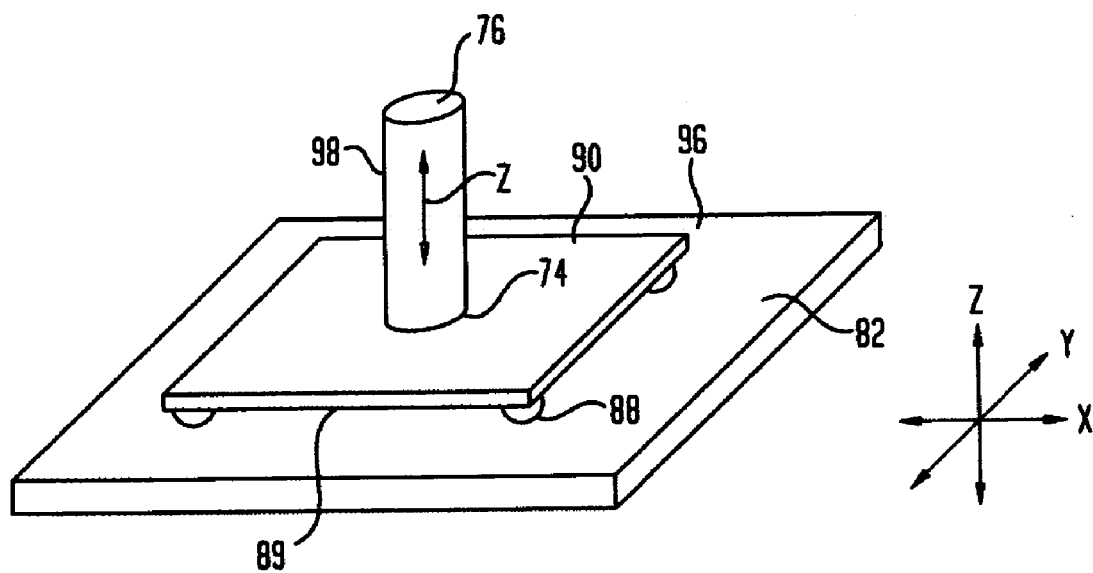
FIG. 5 is a diagrammatic, idealized perspective view depicting a portion of the package shown in FIGS. 1-4.

A significant portion of this relative displacement arises from movement of the bases 74 of the posts relative to one another and relative to microelectronic element 80. Because the posts are attached to flexible substrate 90 and are offset from the support elements 88, and because the support elements space the flexible substrate 90 from the front surface 84 of the microelectronic element, the flexible substrate can deform. Further, different portions of the substrate associated with different posts can deform independently of one another. An idealized representation of the deformation of a single region 89 of substrate 90 is shown in FIG. 5. The support elements 88 disposed at the corners of the region allow the central part of the region to bend downwardly toward the microelectronic element 82, allowing the base of post 98 to also move downward toward the microelectronic element. This deformation is idealized in FIG. 5 as a pure displacement of the post and the center of the region in the vertical or z direction. In practice, the deformation of the substrate may include bending and/or stretching of the substrate so that the motion of the base may include a tilting about an axis in the x-y or horizontal plane as well as some horizontal displacement of the base, and may also include other components of motion. For example, one portion of the region is reinforced by trace 96, and will tend to be stiffer than the other portions of the region. Also, a particular post may be positioned off-center in its region 89, so that the post lies closer to one support element, or to a pair of support elements, on one side of the post. For example, post 98a (FIG. 2) may be disposed closer to support elements 88a and 88b than to support elements 88c and 88d. The relatively small portion of the substrate between the post and support elements 88a and 88b will be stiffer in bending than the relatively large portion of the substrate between the posts and support elements 88c and 88d. Such non-uniformities tend to promote non-uniform bending and hence tilting motion of the posts. Tilting of the posts tends to move the tips 76 toward the microelectronic element. The support elements 88 at the corners of the individual regions substantially isolate the various regions from one another, so that the deformation of each region is substantially independent of the deformation of other regions of the substrate 90. Depending on the configuration of the posts, the posts 98 themselves may also flex or buckle to some degree, which provides additional movement of tips 76 in the vertical or z direction.

The independent displacement of the posts relative to one another allows all of the post tips 76 to contact all of the contact pads 95 on the test substrate. For example, the flexible substrate 90 in the vicinity of conductive post 98C flexes substantially more than the flexible substrate in the vicinity of conductive post 98B. In turn, the flexible substrate 90 in the vicinity of conductive post 98B flexes substantially more than the flexible substrate in the vicinity of conductive post 98A.

Because all of the post tips 76 can be engaged reliably with all of the contact pads 95, the package can be tested reliably by applying test signals, power and ground potentials through the test circuit board 97 and through the engaged posts and contact pads. Moreover, this reliable engagement is achieved with a simple test circuit board 97. For example, the contact pads 95 of the test circuit board are simple, planar pads. The test circuit board need not incorporate special features to compensate for non-planarity or complex socket configurations. The test circuit board can be made using the techniques commonly employed to form ordinary circuit boards. This materially reduces the cost of the test circuit board, and also facilitates construction of the test circuit board with traces (not shown) in a simple layout compatible with high-frequency signals. Also, the test circuit board may incorporate electronic elements such as capacitors in close proximity to the contact pads as required for certain high-frequency signal processing circuits. Here again, because the test circuit board need not incorporate special features to accommodate non-planarity, placement of such electronic elements is simplified. In some cases, it is desirable to make the test circuit board as planar as practicable so as to reduce the non-planarity of the system and thus minimize the need for pin movement. For example, where the test circuit board is highly planar a ceramic circuit board such as a polished alumina ceramic structure, only about 20 μm of pin movement will suffice.

The internal features of package 80 are also compatible with high-frequency signals. The conductive support elements, traces and posts provide low-impedance signal paths between the tips of the posts and the contacts 83 of the microelectronic element. Because each post 98 is connected to an immediately adjacent conductive support element 88, traces 96 are quite short. The low-impedance signal paths are particularly useful in high-frequency operation, as, for example, where the microelectronic element must send or receive signals at a frequency of 300 MHz or more.

Figure 6:
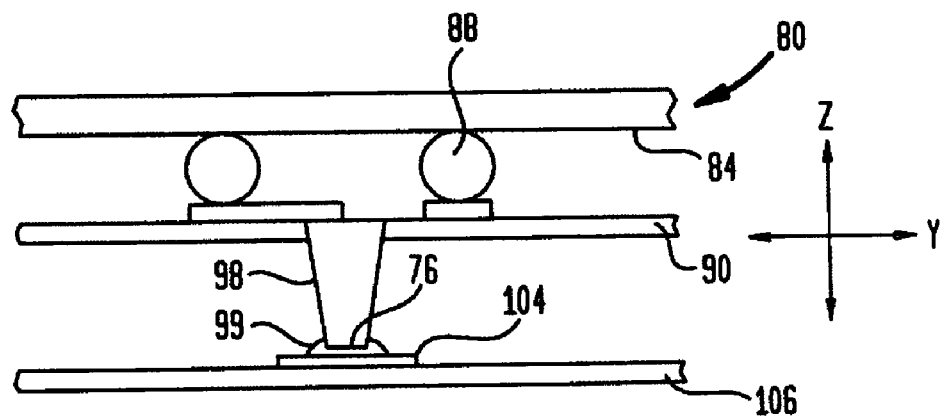
FIG. 6 is a fragmentary sectional view depicting a portion of an assembly including the package of FIGS. 1-5.

After testing the microelectronic package 80 may be removed from the test circuit board 97 and permanently interconnected with another substrate such as a circuit panel 106 (FIG. 6) having contact pads 104, as by bonding the tips 76 of posts 98 to the contact pads of the circuit panel using a conductive bonding material 99 such as a solder. The solder-bonding process may be performed using conventional equipment commonly used for surface-mounting microelectronic components. Thus, the solder masses may be provided on the posts 98 or on the contact pads 104, and may be reflowed after engaging the posts with the contact pads. During reflow, the surface tension of the solder tends to center the posts on the contact pads. Such self-centering action is particularly pronounced where the tips of the posts are smaller than the contact pads. Moreover, the solder 99 wets the sides of the posts to at least some extent, and thus forms a fillet encircling the tip of each post, as well as a strong bond between the confronting surfaces of the posts and pads.

Moreover, the tips 76 of the posts 98 can move relative to the microelectronic element 82 to at least some degree during service so as to relieve stresses arising from differential thermal expansion and contraction. As discussed above in connection with the testing step, the individual posts 98 can move relative to the microelectronic element and relative to the other posts by flexure or other deformation of substrate 90. Such movement can appreciably relieve stresses in the solder bonds between the posts and the contact pads which would otherwise occur upon differential thermal expansion or contraction of the circuit board 106 and microelectronic element 80. Moreover, the conductive support elements or solder balls 88 can deform to further relieve stresses in solder masses 99. The assembly is highly resistant to thermal cycling stresses, and hence highly reliable in service.

An underfill material 101 such as an epoxy or other polymeric material may be provided around the tips of the posts and around the contact pads, so as to reinforce the solder bonds. Desirably, this underfill material 101 only partially fills the gap between the package 80 and the circuit board 106. In this arrangement, the underfill 101 does not bond the flexible substrate 90 or the microelectronic device to the circuit board. The underfill 101 only reinforces the posts at their joints with the contact pads. However, no reinforcement is required at the bases of the posts, inasmuch as the joint between the base of each post and the associated trace is extraordinarily resistant to fatigue failure.

The assembly is also compact. Some or all of the posts 98 and contact pads 104 are disposed in the area occupied by the microelectronic element 80, so that the area of circuit board 106 occupied by the assembly may be equal to, or only slightly larger than, the area of the microelectronic element itself, i.e., the area of the front surface 84 of the microelectronic element 80.

Figure 7:
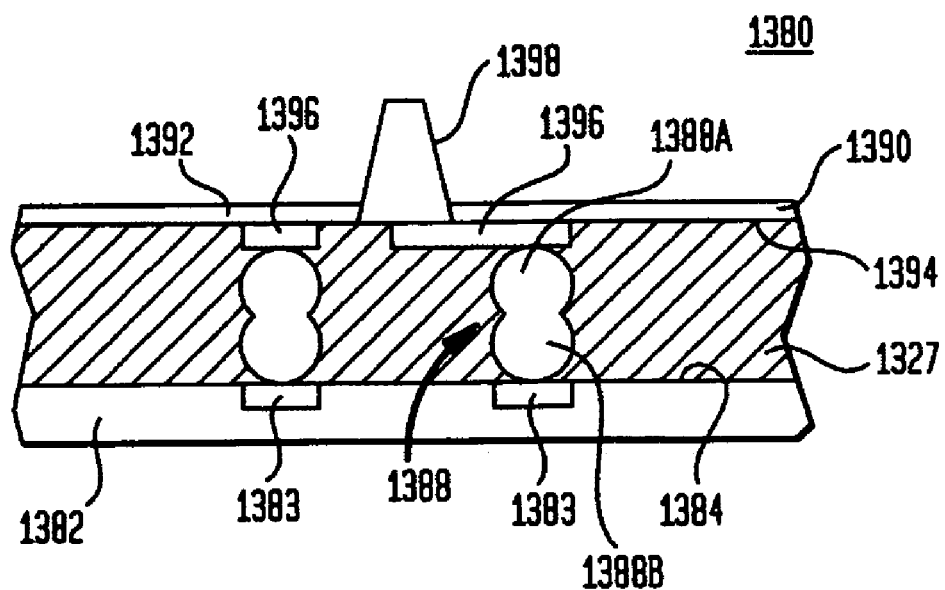

FIG. 7 shows a portion of a microelectronic package 1380 in accordance with another embodiment of the present invention. This package includes a microelectronic element 1382, such as a semiconductor chip, having contacts 1383 on a face surface thereof. The package also includes a flexible substrate 1390 such as a flexible dielectric film having a top surface 1392, a bottom surface 1394, conductive traces 1396 and conductive posts 1398 projecting from the top surface 1392. The conductive posts 1398 are electrically interconnected with traces 1396 at the bases of the posts. One or more of the conductive traces 1396 are electrically interconnected with contacts 1383 by conductive elements 1388. These features may be similar to the corresponding features of the embodiment discussed above with reference to FIGS. 1-6. In the embodiment shown in FIG. 7, each conductive support element 1388 includes two conductive elements stacked one atop another so that a first conductive element 1388A is positioned over a second conductive element 1388B. Conductive elements 1388A and 1388B are fused with one another to from an elongated conductive element 1388. In other preferred embodiments, three or more conductive elements may be stacked one atop another between conductive trace 1396 and contact 1383. The stacking of the conductive elements enables the height of the flexible substrate 1390 to be adjusted relative to the surface of the semiconductor chip 1382. This provides additional clearance between the flexible substrate 1390 and the chip surface 1384, which can accommodate additional displacement of the post bases. Moreover, the elongated conductive elements 1388 are more readily deformable, which can provide additional movability to the posts.

In the embodiment of FIG. 7, a compliant material 1327 is positioned between the flexible substrate 1390 and the microelectronic element 1382. The compliant layer 1327 preferably does not substantially restrict movement of the posts. The compliant material prevents contaminants from entering the package. Merely by way of example, compliant material 1327 may be a gel, foam or the like. Despite the presence of the compliant material, conductive elements 1388 still support the flexible substrate 1390 to a substantial degree.

Figure 8:
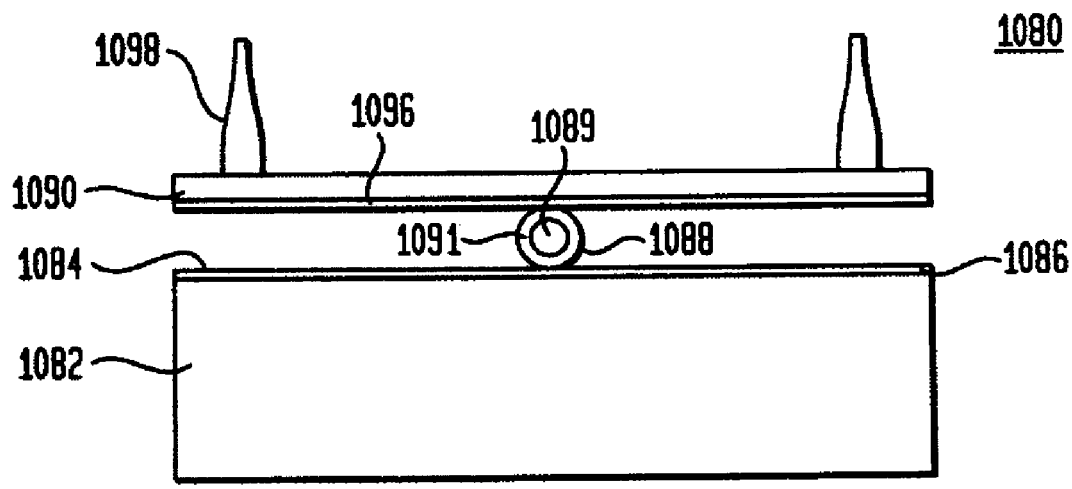

Referring to FIG. 8, a package according to a further preferred embodiment of the present invention is similar to the packages discussed above, except that each conductive support elements 1088 includes a core 1089 covered by an outer conductive coating 1091. Core 1089 may be a conductive, high-melting material such as copper, whereas coating 1091 may be a lower-melting material such as a solder. Alternatively, core 1089 may be formed from a nonconductive material such as glass, ceramic or a polymer.

In a package according to yet another preferred embodiment of the present invention, the conductive support elements include elongated conductive pillars 1188. These pillars may be formed integrally with traces 1196 and posts 1198. The tips of pillars 1188 abut the contacts (not shown) of microelectronic element 1182, and may be bonded to the contacts by a solder, eutectic bonding material, diffusion bond or other metallurgical bond.

Figure 10:
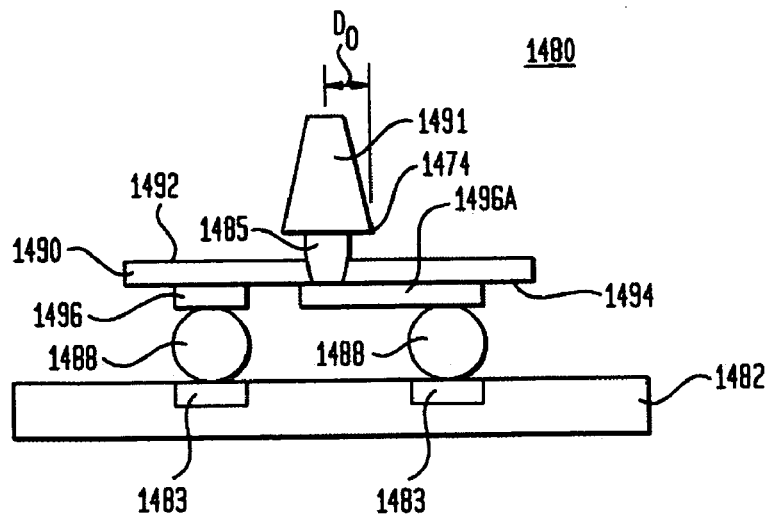

FIG. 10 shows a microelectronic package 1480 in accordance with yet another preferred embodiment of the present invention. The microelectronic package 1480 includes a microelectronic element 1482 such as a semiconductor chip having a front or contact-bearing surface with contacts 1483. The microelectronic element 1482 has a relatively fine pitch so that the contacts 1483 and support elements 1488 are relatively close to one another. In this arrangement, the offset distance $D_o$ between the base 1474 of each post and the adjacent support elements 1488 is relatively small; a portion of the base may overlap with the adjacent support elements. Here again, flexible substrate 1490 includes top surface 1492 and bottom surface 1494 remote therefrom, and conductive traces 1496 are provided on the flexible substrate. In this embodiment, the package also includes a focusing conductive element 1485 positioned between the base 1474 of each conductive post 1498 and the top surface 1492 of flexible substrate 1490. The focusing or second conductive element 1485 has a smaller area than does the base of conductive post 1498. The focusing conductive elements mechanically interconnect the bases of the posts with the flexible substrate and traces 1496, and also electrically interconnect the posts and the traces. The relatively small area of the focusing elements helps to maintain the flexibility of the flexible substrate 1490 and traces. Stated another way, the focusing conductive elements 1485 facilitate movement of the conductive posts 1495 in a fine pitch environment. The focusing conductive elements can be formed integrally with the posts and traces as, for example, by etching the bases of the posts after protecting the remainder of the posts using a suitable mask or plating. Focusing conductive elements can be employed to enhance the movability of conductive posts in structures where a flexible substrate is supported by elements other than support elements. For example, focusing conductive elements can be provided in structures of the type shown in embodiments of the aforementioned U.S. Pat. No. 6,177,636 where a flexible substrate is supported only by a compliant layer or by compliant pads disposed beneath the posts.

Figure 11:
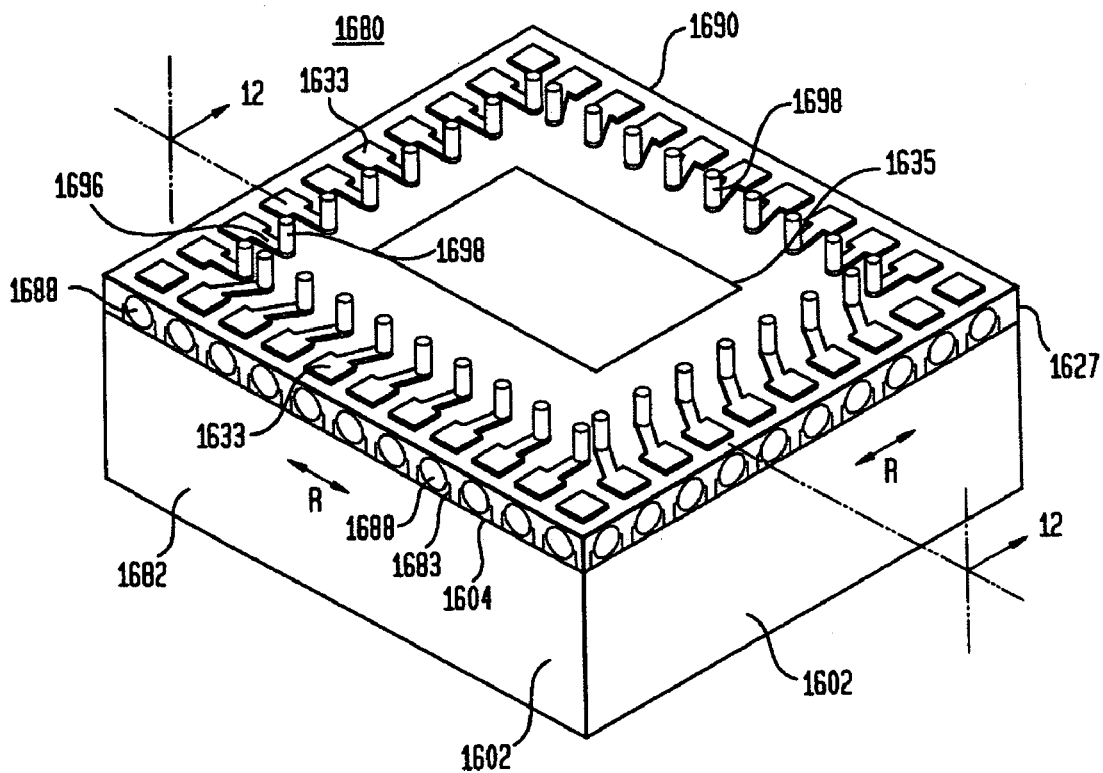
FIG. 11 is a diagrammatic perspective view depicting a package according to a further embodiment of the invention.
Figure 12:
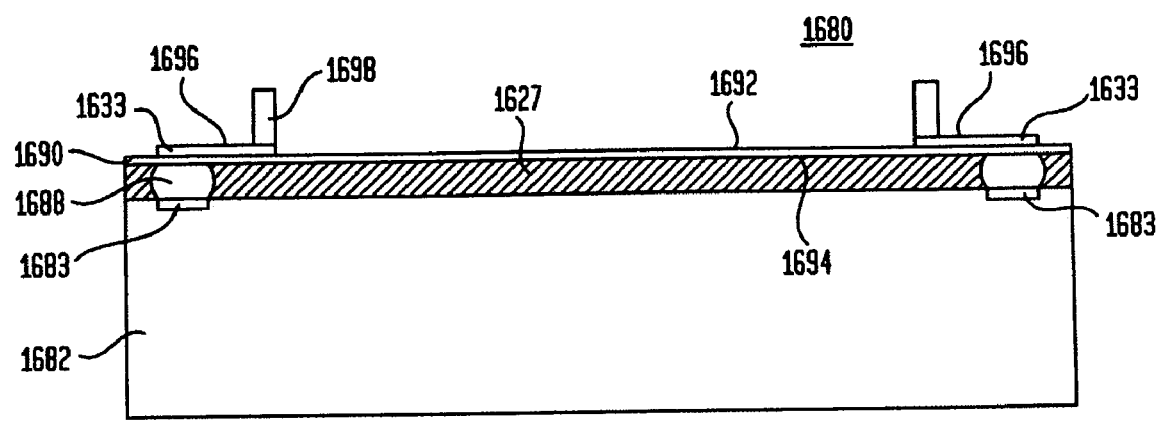
FIG. 12 is a diagrammatic sectional view of the package shown in FIG. 11.

As shown in FIGS. 11 and 12, a microelectronic package 1680 according to a further embodiment includes a microelectronic element 1682, such as a semiconductor chip, having contacts 1683 exposed at a front surface thereof. In this embodiment, however, the contacts 1383 are not disposed in a uniform array but instead are disposed in rows 1604 disposed adjacent the edges 1602 of the chip. Each row thus extends in a row direction R in the horizontal plane of the chip front surface, such row direction being parallel to the edges of the chip. Here again, the package includes a flexible dielectric substrate 1690, having a top surface 1692 and a bottom surface 1694. The flexible substrate 1690 includes contact pads 1633 disposed on top surface 1692 and accessible at bottom surface 1694 through holes in the substrate. Conductive traces 1696 extend from the contact pads to posts 1698. Here again, the flexible substrate 1690 is assembled with the microelectronic element 1682 using conductive elements 1688, such as solder balls. Here again, the conductive elements 1688 space and at least partially support the flexible substrate 1680 over the contact bearing face of the microelectronic element 1682. In addition, the conductive elements 1688 form an electrical interconnection between contacts 1684 of microelectronic element 1682 and conductive pads 1633 of flexible substrate 1690, and thus connect posts 1698 to contacts 1683. The microelectronic package 1680 optionally includes a compliant layer 1627, such as a curable elastomer, gel or the like disposed between the bottom surface 1694 of flexible substrate 1690 and the font face of microelectronic element 1682. In a further variant, the compliant layer may also comprise a porous compliant layer formed from a multiplicity of pads defining channels between the pads. A curable elastomer optionally may be injected in the channels between the compliant pads, as disclosed in commonly assigned U.S. Pat. No. 5,659,952, the disclosure of which is hereby incorporated by reference herein.

Here again, posts 1698 are offset from the support elements 1688 and contacts 1683. In this case, the offset directions of the posts are transverse to the row directions R. That is, each post is offset from the associated contact pad 1633, support element 1688 and contact pad 1683 in a direction transverse to the row direction of the row containing the associated contact pad 1683. The offset directions point inwardly, toward the geometric center of the chip front surface, so that the posts are disposed inside the area bounded by the rows. Stated another way, traces 1696 fan in from the contact pads 1633 to the posts 1698.

Referring to FIG. 11, the flexible substrate 1690 has an opening 1635 so as to enhance the flexibility of the flexible substrate. In this embodiment as well, the conductive posts have can move relative to the contact bearing face of the microelectronic element 1682.

Figure 20:
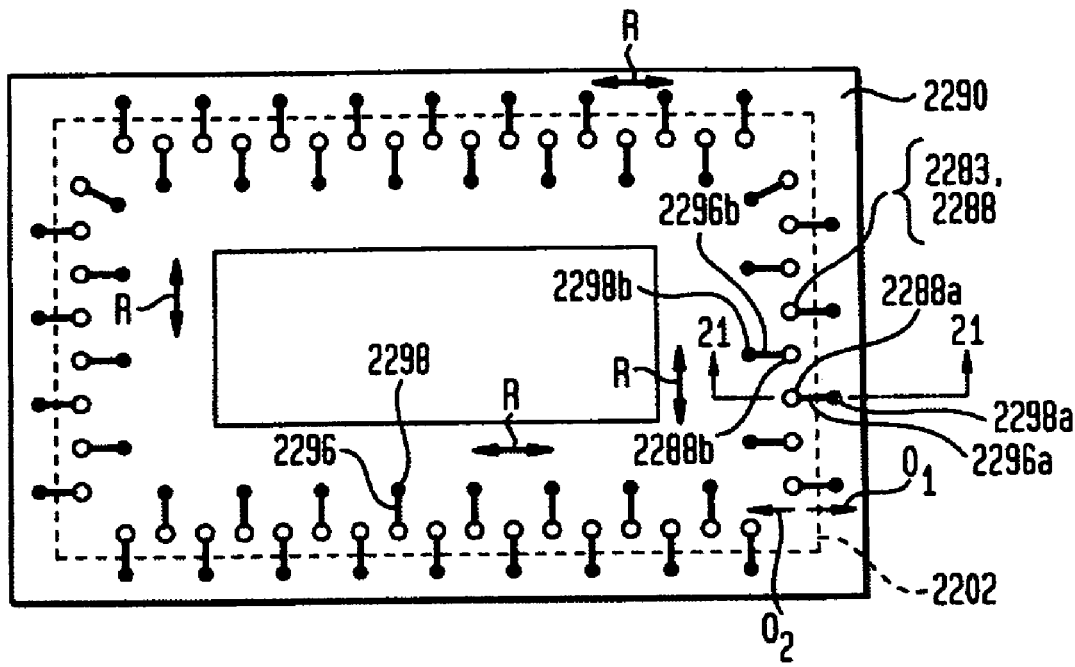
FIG. 20 is a diagrammatic top plan view of a package in accordance with another embodiment of the invention.
Figure 21:
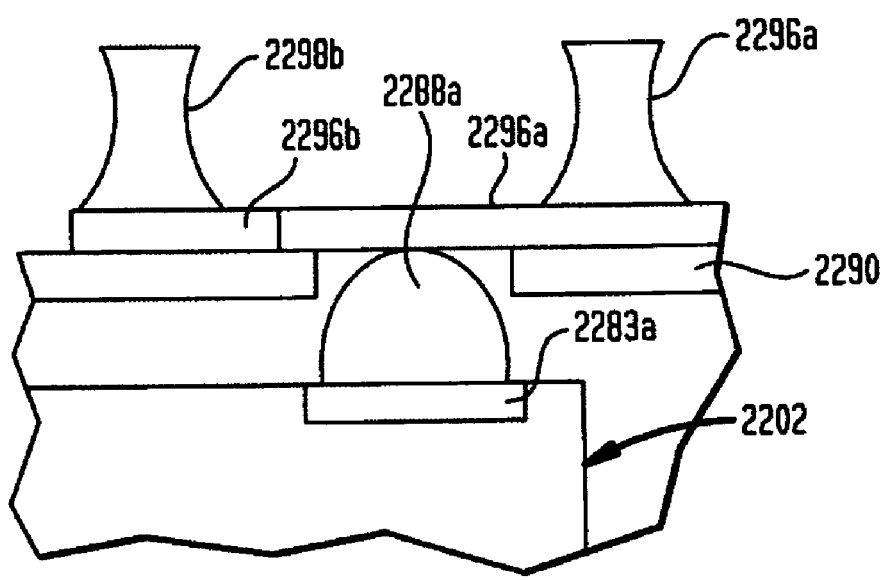
FIG. 21 is a fragmentary, diagrammatic sectional view taken along line 21-21 in FIG. 20.

In a further, related embodiment shown in FIGS. 20 and 21, the chip 2202 has contacts 2283 disposed in rows, each such row extending in a row direction R. In this embodiment as well, each row is disposed adjacent to an edge of the chip. Here again, conductive support elements 2288 are provided on the contacts. In this embodiment, the conductive support elements are in the form of studs rather than solder balls. Studs are small conductive elements applied in a process commonly referred to as "stud bumping". For example, each stud may include a small mass of a metal such as gold or aluminum. The stud bumping process may be performed using equipment similar to that employed in wire bonding. The bonding tool typically carries a small ball of the metal, and bonds the ball to the chip contact using heat, sonic vibrations, pressure or some combination of these. In other stud bumping techniques, numerous stud bumps are applied to numerous contacts simultaneously. The stud bumping process can be performed on a wafer, prior to subdividing the wafer into individual chips.

In the embodiment of FIGS. 20 and 21, the posts 2298 are disposed on a flexible dielectric substrate 2290 carrying traces 2296. Posts 2298 are disposed in rows which extend generally parallel to the rows of contacts and support elements. However, the posts associated with each row of contacts and support elements are offset from the support elements in such row in two opposite directions transverse to the row direction. Thus, post 2298a is offset from the row in one direction $O_1$ (to the right as seen in FIG. 20) whereas post 2298b is offset in the opposite direction $O_2$ (to the left as seen in FIG. 20). The opposite offsets split the posts 2298 associated with each row of contacts and support elements into two rows, one such row of posts lying inboard of the row of support elements 2283 and the other such row of posts lying outboard of the row of support elements. This arrangement increases the spacing between adjacent posts; such spacing, on average, will be about twice the spacing between adjacent contacts on the chip. This is advantageous in that it allows for larger contact pads on the circuit board or other substrate to which the unit will be attached and also decreases the precision required in placing the unit onto the circuit board. Moreover, placing the posts associated with each row of contacts and support elements on opposite sides of the row of contacts and support elements minimizes shear loads in horizontal directions applied to the conductive support elements when the posts are engaged with contacts pads on a substrate. Forces applied to the tips of the posts tending to bend the substrate 2290 and traces 2296 may also place the substrate in tension, and may apply horizontally directed force components to the support elements. However, the horizontally directed components applied by posts on opposite sides of the row of support elements (such as by posts 2296a and 2296b) tend to balance one another. Stated another way, each support element 2283 lies between posts.

In the particular embodiment of FIGS. 20 and 21, the flexible substrate 2290 extends outwardly beyond the edges of chip 2202, and those posts disposed outboard of the contacts (such as post 2296a) are disposed in whole or in part beyond the edges of the chip. To provide additional support for these posts, a support element (not shown) may encircle the chip. Alternatively or additionally, an encapsulant (not shown) optionally may be provided around the edges of the chip, and optionally between the chip and substrate 2290.

Figure 13:
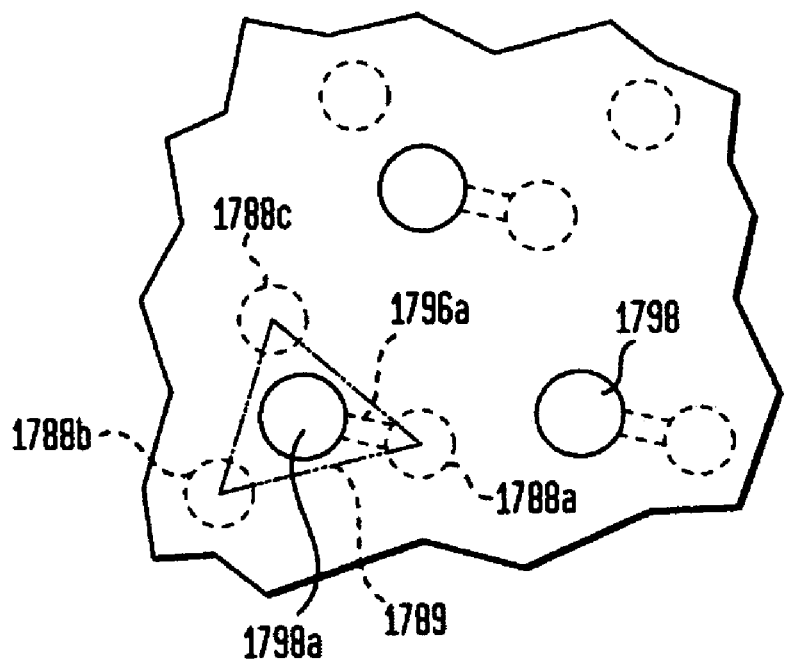
FIGS. 13 and 14 are fragmentary plan views similar to FIG. 2 but depicting packages according to further embodiments of the invention.

Numerous further variations and combinations of the features discussed above can be used. For example, where the contacts on a chip are disposed in an array, such array need not be a rectilinear, regular array as shown in FIG. 2. For example, as shown in FIG. 13, the contacts and support elements 1788 may be disposed in an irregular pattern or in a hexagonal or triangular array. In the particular pattern of FIG. 13, post 1798a lies in a region 1789 bounded by three support elements 1788a, 1788b and 1788c, and is electrically connected to one of these support elements by a trace 1796a.

Figure 14:
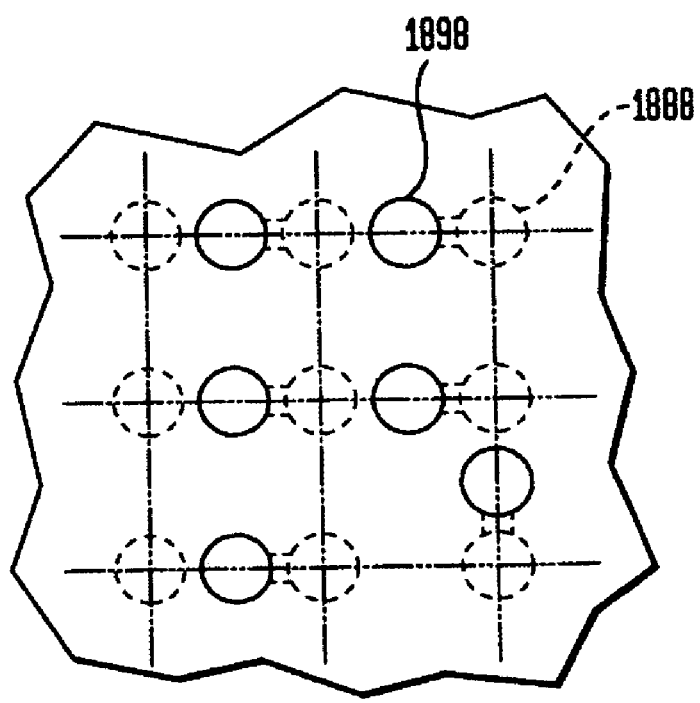

In a further arrangement (FIG. 14), the support elements 1888 are arranged in rectilinear rows and columns, but the posts are disposed in the rows or columns such that each post lies between two adjacent support elements 1888. Moreover, it is not essential to have a one-to-one association between posts, traces and support elements. For example, a given post may be connected by two or more traces to two or more posts. Conversely, a given support element may be electrically connected to two or more posts. In yet another variant, one or more of the posts may be electrically connected to support elements remote from such posts. Also, the flexible substrate may include elements such as conductive planes which serve as ground planes or power distribution planes.

Figure 15:
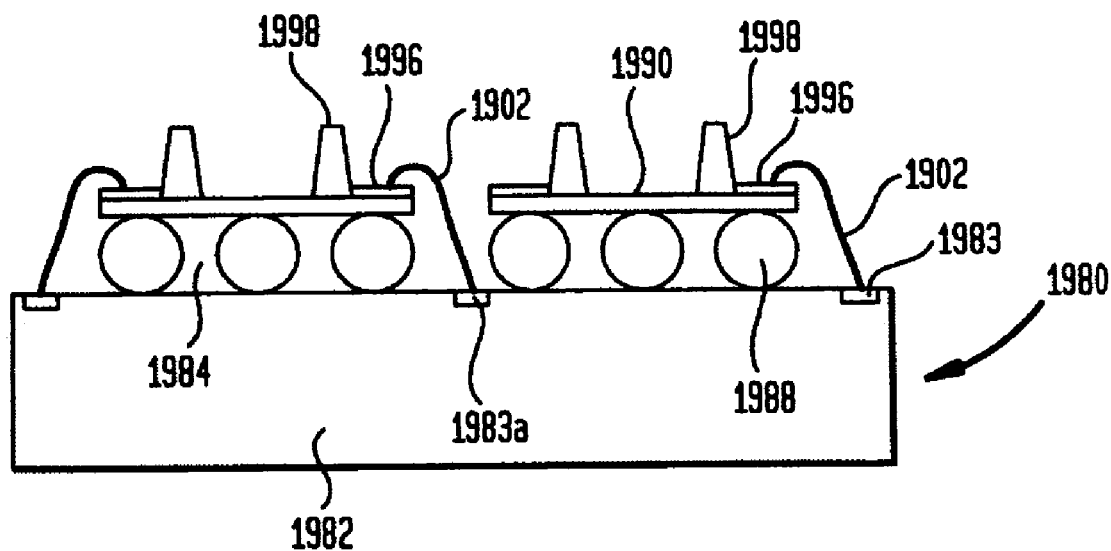
FIGS. 15 and 16 are diagrammatic sectional view depicting packages according to still further embodiments of the invention.

The support elements need not be electrically conductive. For example, as shown in FIG. 15, a package 1980 includes a flexible support substrate 1990 supported over the front surface 1984 of a chip 1982 by support elements 1988 which are formed from a dielectric material as, for example, small spheres of glass or polymer. The traces 1996 on the flexible substrate, and hence the posts 1998, are electrically connected to the contacts 1983 of the chip by wire bonds. Here again, the posts 1998 are offset from the support elements 1988 so that the bases of the posts can move upon flexure of the support element 1990. In the embodiment of FIG. 15, some of the contacts 1983a on the chip are disposed in one or more rows adjacent the center of the chip, whereas others are disposed in rows adjacent the edges of the chip. In a further variant (not shown), the contacts of the chip are connected to the traces 1998 by leads formed integrally with the traces. Leads 1902 extend to center contacts 1983a through a slot or hole in substrate 1990. Alternatively, two separate substrates can be positioned on opposite sides of the center contact row.

Figure 16:
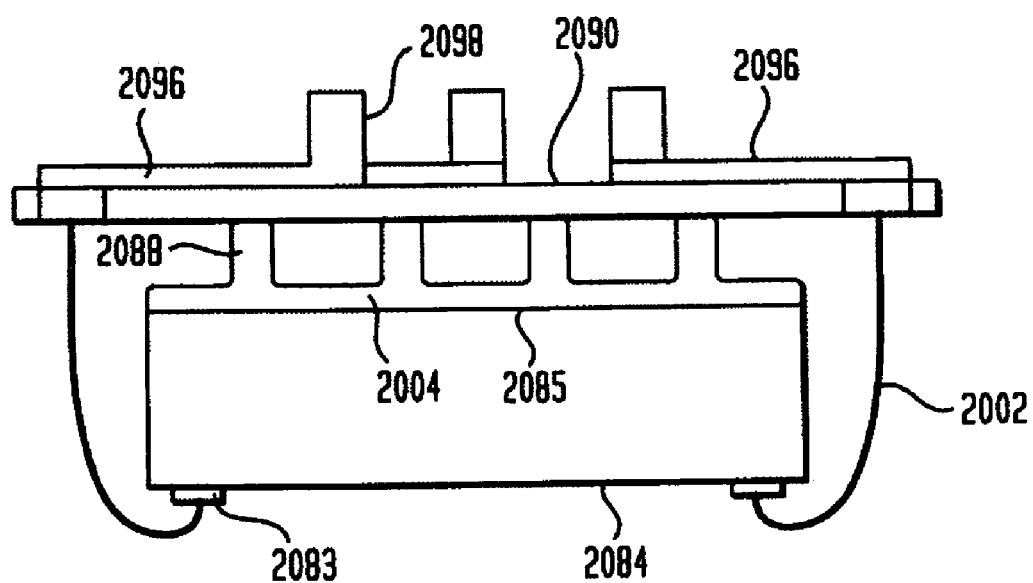

In yet another variant (FIG. 16) the flexible substrate 2090 is supported over a rear surface 2085, opposite from the contact-bearing or front surface 2084. Stated another way, the chip is "face-up" relative to substrate 2090. The traces 2096 of and hence the posts 2098 are electrically connected to the contacts 2083 by leads 2002 such as wire bonds or leads integral with the traces. Here again, the posts 2098 are offset from the support elements 2088 so that in this embodiment as well, movement of the posts is facilitated by flexing of the substrate between support elements. In the embodiment of FIG. 16, support elements 2088 are nonconductive and are formed as portions of a continuous layer 2004. Merely by way of example, such a continuous layer with projecting support elements may be formed by molding or embossing a polymeric layer.

The foregoing discussion has referred to an individual microelectronic element. However, the package may include more than one microelectronic element or more than one substrate. Moreover, the process steps used to assemble the flexible substrate, support elements and posts to chips may be performed while the chips are in the form of a wafer. A single large substrate may be assembled to an entire wafer, or to some portion of the wafer. The assembly may be severed so as to form individual units, each including one or more of the chips and the associated portion of the substrate. The testing operations discussed above may be performed prior to the severing step. The ability of the packages to compensate for non-planarity in a test board or in the wafer itself greatly facilitates testing of a large unit.

Figure 17:
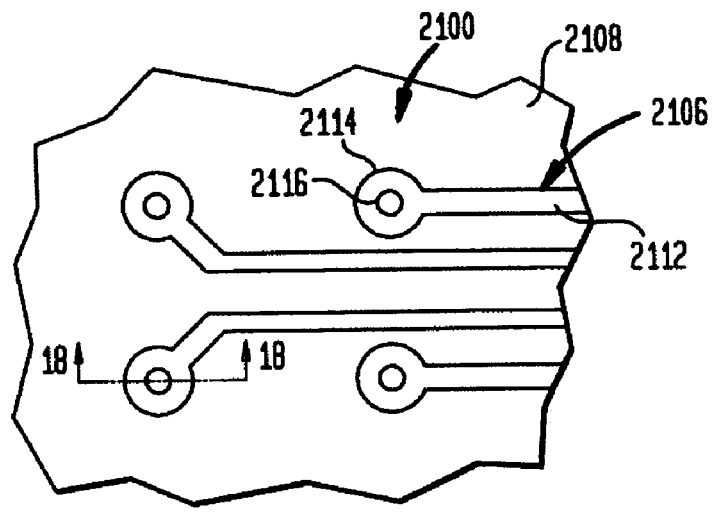
FIG. 17 is a fragmentary plan view depicting a portion of a package according to yet another embodiment of the invention.
Figure 18:
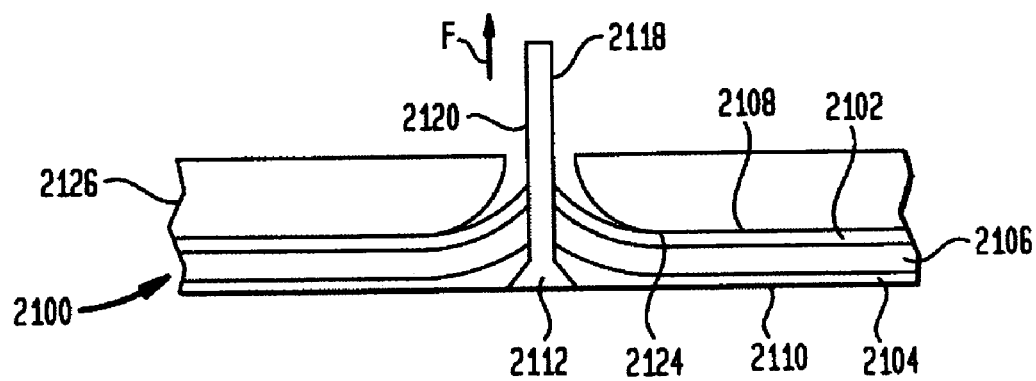
FIG. 18 is a fragmentary sectional view taken along line 18-18 in FIG. 17.

The posts may be fabricated separately from the substrate and traces and then assembled to the substrate. One such a process uses a substrate 2100 (FIG. 17) having a top dielectric layer 2102, a bottom dielectric layer 2104 (FIG. 18) and traces 2106 extending between these dielectric layers. Layer 2102 defines a top surface 2108 whereas bottom layer 2106 defines a bottom surface 2110 of the substrate. Traces 2106 include elongated sections 2112 and lands 2114 broader than elongated sections 2112. The traces have holes 2116 disposed in the lands. The dielectric layers 2102 and 2104 may or may not have holes aligned with holes 2116. Posts 2118 having elongated sections 2120 are forced through the substrate in the upward direction, from the bottom surface to the top surface, as indicated by arrow F in FIG. 18. The posts embed themselves in the substrate and are held in place by the elasticity of the substrate and the traces. The posts also make electrical contact with traces 2106. Elongated portions 2120 of the posts protrude from the top surface 2108.

The substrate and traces may deform locally in regions surrounding the posts. These regions tend to deform upwardly, leaving concavities 2124 in the bottom surface of the substrate. The posts may have heads 2122, and these heads may be lodged partially or completely within the concavities. To control deformation of the substrate, the top surface 2108 of the substrate may be abutted against a die 2126 having holes aligned with locations where posts are forced through the substrate. Such a die can also help to prevent delamination of the substrate and traces. In variants of the process, the traces may be disposed on the top or bottom surface of a single-layer substrate. The resulting post-array substrate can be assembled with a microelectronic element to form a package as discussed above, or can be used in any other microelectronic assembly where a small post array is desirable. The assembly process allows selective placement of posts. It is not essential to provide the lands 2114 and holes 2116 in the traces. Thus, posts can be placed at any location along any trace. Moreover, the posts may be formed from essentially any conductive material. Different posts may be formed from different materials. For example, posts subject to severe mechanical loading can be formed entirely or partially from hard refractory metals such as tungsten, while other posts may be formed from softer metals such as copper. Also, some or all of the posts may be formed entirely or partially from corrosion-resistant metals such as nickel, gold or platinum.

Figure 19:
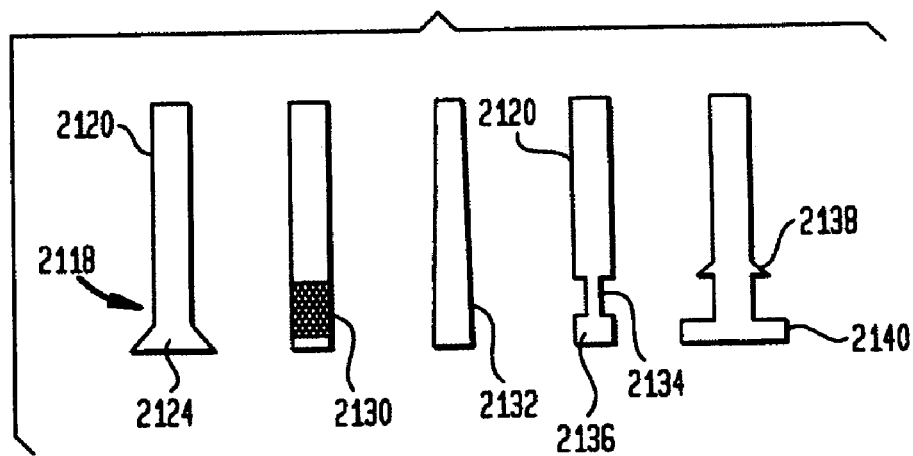
FIG. 19 is a diagrammatic elevational view depicting components usable in the embodiment of FIGS. 17 and 18.

As mentioned above, posts 2118 may include heads 2124 of larger diameter than the other portions of the posts. As shown in FIG. 19, a post may include features such as a knurl 2130 in the region of the post which is to engage the trace; a tapered configuration 2132. Alternatively or additionally, a posts may include a narrow section 2134 having diameter smaller than the projecting section 2120 and a head 2136 having larger diameter than narrow section 2134. This provides a snap action during assembly; the substrate and trace stretch as section 2120 passes through them, and then snap back to engage the narrow section. In yet another alternative, the posts may have outwardly projecting barbs 2138 and heads 2140, so that the substrate and trace become engaged between the barbs and the heads. The individual posts may be formed by mass-production processes of the type commonly used to make miniature rod-like elements, such as cold-heading, thread rolling or precision machining.

In certain preferred embodiments of the present invention, a particle coating such as that disclosed in U.S. Pat. Nos. 4,804,132 and 5,083,697, the disclosures of which are incorporated by reference herein, may be provided on one or more electrically conductive parts of a microelectronic package for enhancing the formation of electrical interconnections between microelectronic elements and for facilitating testing of microelectronic packages. The particle coating is preferably provided over conductive parts such as conductive terminals or the tip ends of conductive posts. In one particularly preferred embodiment, the particle coating is a metalized diamond crystal coating that is selectively electroplated onto the conductive parts of a microelectronic element using standard photoresist techniques. In operation, a conductive part with the diamond crystal coating may be pressed onto an opposing contact pad for piercing the oxidation layer present at the outer surface of the contact pad. The diamond crystal coating facilitates the formation of reliable electrical interconnections through penetration of oxide layers, in addition to traditional wiping action.

Referring to FIGS. 22A-22D, in accordance with certain preferred embodiments of the present invention, a connection component or interposer 2380 includes a flexible, dielectric substrate 2390 having a top surface 2392 and a bottom surface 2394. The connection component 2380 includes a plurality of conductive posts 2398 that are attached to the flexible substrate 2390 and that project from the second surface 2394 of the substrate. Each post 2398 preferably has a tip end 2376 adapted for forming an electrical interconnection with a conductive element such as a contact pad. The connection component 2380 also includes conductive traces 2396 having first ends 2400 and second ends 2402 connected with the conductive posts 2398. The conductive traces 2396 extend over the first surface 2392 of the flexible substrate 2390.

Before assembling the connection component 2380 with a microelectronic element such as a semiconductor chip, the connection component 2380 is positioned atop a sacrificial layer 2491 having openings 2493 extending therethrough. The openings 2493 may be formed by a laser, or by using techniques such as punching, drilling or etching. The sacrificial layer 2491 has a top surface 2494, a bottom surface 2496 and a height $H_1$ defined by the distance between the top surface and the bottom surface. The height $H_1$ is desirably greater than the height of the conductive posts 2398. The sacrificial layer 2491 is preferably made of a heat resistant material.

The sacrificial layer 2491 may be attached to the connection component 2380 either during or after fabrication of the connection component 2380. An adhesive material 2498, such as an adhesive layer having relatively low tackiness, may be provided over the top surface 2494 of the sacrificial layer 2491. The adhesive material preferably temporarily attaches the connection component 2380 to the sacrificial layer during fabrication of the microelectronic assembly.

Referring to FIG. 22B, a microelectronic element 2382, such as a semiconductor chip, has contacts 2383 accessible at a front face 2384 thereof. In order to assemble the microelectronic element 2382 with the connection component 2380, the front face 2384 of the microelectronic element is juxtaposed with the first surface 2392 of the flexible substrate 2390.

Referring to FIG. 22C, conductive support elements 2388 are provided in contact with traces 2396 for electrically interconnecting the microelectronic element 2382 with the connection component 2380. A layer of a compliant encapsulant 2327 may be disposed around the conductive support elements 2388 and between the microelectronic element 2382 and the flexible substrate 2390.

Referring to FIG. 22D, an overmold 2495 is formed around the microelectronic assembly. The overmold 2495 preferably covers the rear face and edges of the chip 2382 and the top surface 2392 of the flexible substrate 2390. The overmold 2495 preferably prevents contamination of the assembly and adds stability to the package. Although the present invention is not limited by any particular theory of operation, it is believed that the sacrificial layer supports the flexible substrate 2390 during assembly of the microelectronic assembly, and particularly when forming the electrical interconnection between the microelectronic element 2382 and the connection component 2380. The sacrificial layer 2491 also preferably provides planarity for the components, such as when the overmold material flows under the microelectronic element 2382, so as to provide a thinner assembly. After the assembly has been completed, the sacrificial layer 2491 may be removed or stripped away to expose the conductive posts for connection with another microelectronic element.

Figure 23:
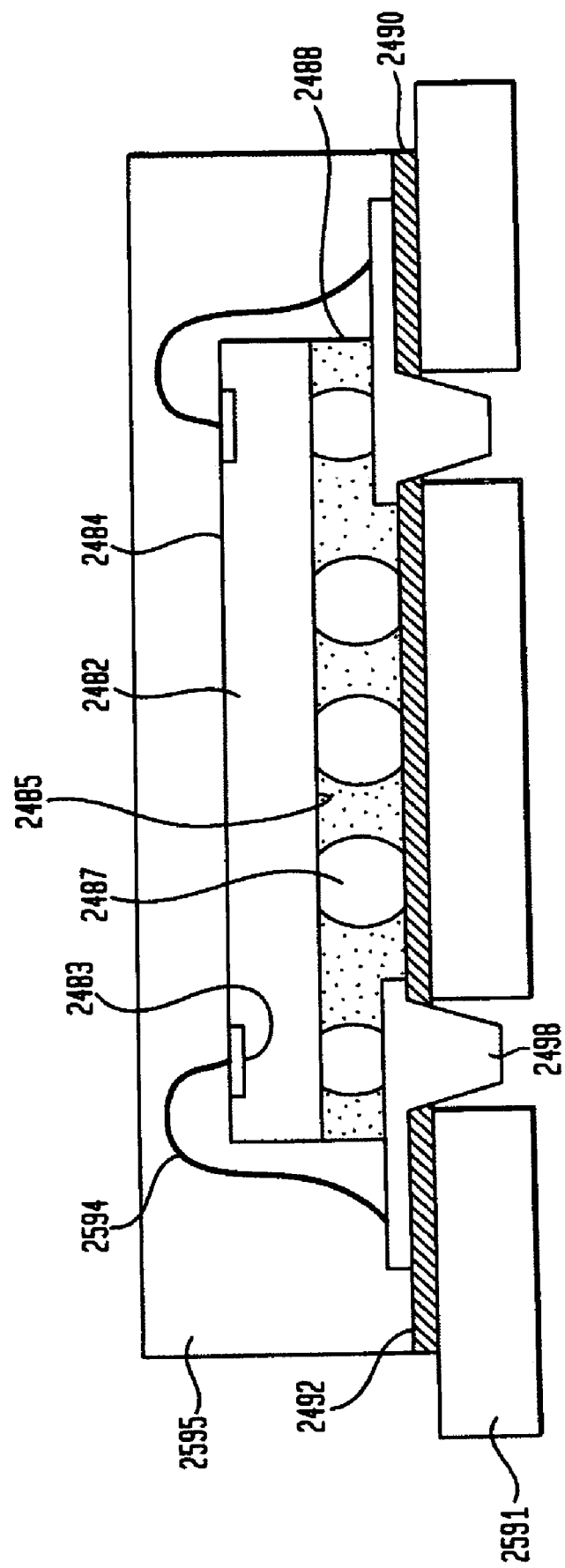
FIG. 23 shows a method of making a microelectronic assembly, in accordance with further preferred embodiments of the present invention.

FIG. 23 shows a microelectronic assembly atop a sacrificial layer 2591. The Sacrificial layer has a top surface 2594, a bottom surface 2596 and an opening 2593 extending between the top and bottom surfaces. The sacrificial layer 2591 supports a connection component including a flexible substrate 2390 and conductive posts 2498. The assembly includes a microelectronic element 2482 having a front face 2484 with contacts 2483 and a rear surface 2485 remote therefrom. The assembly also includes support elements 2487 that abut against the rear face 2485 of the microelectronic element 2482 for supporting the microelectronic element above the flexible substrate 2390. In the particular embodiment shown in FIG. 23, the support elements 2487 are preferably non-conductive. The microelectronic element 2482 is electrically interconnected with conductive traces using conductive wire 2594. An overmold 2595 is preferably formed over the microelectronic element 2482 and the top surface 2492 of the flexible substrate 2490. After fabrication of the assembly, the sacrificial layer 2591 may be removed for exposing the conductive posts 2498 so that the assembly may be electrically interconnected with another microelectronic element, such as a printed circuit board. The methods described above with reference to FIGS. 22A-22D and 23 may also be performed on a wafer scale. The sacrificial layer may be removed either before the wafer is severed or after the wafer is severed into one or more packages.

As discussed above, the motion of the posts may include a tilting motion. This tilting motion causes the tip of each post to wipe across the contact pad as the tip is engaged with the contact pad. This promotes reliable electrical contact. As discussed in greater detail in the co-pending, commonly assigned application Ser. No. 10/985,126 filed Nov. 10, 2004, entitled "MICRO PIN GRID ARRAY WITH WIPING ACTION," the disclosure of which is incorporated by reference herein, the posts may be provided with features which promote such wiping action and otherwise facilitate engagement of the posts and contacts. As disclosed in greater detail in the co-pending, commonly assigned application Ser. No. 10/985,119 filed Nov. 10, 2004, entitled "MICRO PIN GRID WITH PIN MOTION ISOLATION," the disclosure of which is also incorporated by reference herein, the flexible substrate may be provided with features to enhance the ability of the posts to move independently of one another and which enhance the tilting and wiping action.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic assembly comprising:
a microelectronic package comprising
a microelectronic element having faces and contacts,
a flexible substrate spaced from and overlying a first face of said microelectronic element,
a plurality of conductive posts extending from said flexible substrate and projecting away from the first face of said microelectronic element, at least some of said conductive posts being electrically interconnected with said microelectronic element, and
a plurality of support elements disposed between said microelectronic element and said substrate and supporting said flexible substrate over said microelectronic element, at least some of said conductive posts being offset from said support elements; and
a circuitized substrate having conductive pads confronting said conductive posts of said microelectronic package, wherein said conductive posts are electrically interconnected with said conductive pads.

2. The assembly as claimed in claim 1, wherein said microelectronic element is selected from the group consisting of a semiconductor chip and a semiconductor wafer.

3. The assembly as claimed in claim 1, wherein said conductive posts have tips in contact with said conductive pads of said circuitized substrate.

4. The assembly as claimed in claim 1, further comprising an electrically conductive bonding material securing said conductive posts to said conductive pads.

5. The assembly as claimed in claim 3, wherein at least some of said support elements are electrically conductive, the at least some of said conductive support elements electrically interconnecting at least some of said contacts of said microelectronic element with at least some of said conductive posts.

6. The assembly as claimed in claim 5, further comprising conductive traces provided on said flexible substrate, wherein said conductive traces electrically interconnect at least some of said conductive posts with at least some of said conductive support elements.

7. The assembly as claimed in claim 5, wherein at least one of said conductive support elements comprises a mass of a fusible material.

8. The assembly as claimed in claim 5, wherein at least one of said conductive support elements comprises a dielectric core and an electrically conductive outer coating over the dielectric core.

9. The assembly as claimed in claim 1, wherein said flexible substrate comprises a dielectric sheet.

10. The assembly as claimed in claim 1, further comprising a compliant material disposed between said flexible substrate and said microelectronic element.

11. The assembly as claimed in claim 1, wherein at least one of said conductive posts is elongated.

12. The assembly as claimed in claim 1, wherein said support elements are disposed in an array so that said support elements define a plurality of zones of said flexible substrate, each said zone being bounded by a plurality of said support elements defining corners of said zone, different ones of said conductive posts being disposed in different ones of said zones.

13. The assembly as claimed in claim 12, wherein only one of said conductive posts is disposed in each of said zones.

* * * * *